(12) United States Patent
Chen

(10) Patent No.: US 12,276,705 B2
(45) Date of Patent: Apr. 15, 2025

(54) BATTERY CELL SAMPLING VOLTAGE COMPENSATION METHOD AND APPARATUS AND ELECTRIC APPARATUS

(71) Applicant: CONTEMPORARY AMPEREX TECHNOLOGY (HONG KONG) LIMITED, Hong Kong (CN)

(72) Inventor: Shaoyan Chen, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/473,316

(22) Filed: Sep. 25, 2023

(65) Prior Publication Data

US 2024/0061052 A1 Feb. 22, 2024

Related U.S. Application Data

(63) Continuation of application No. PCT/CN2021/123018, filed on Oct. 11, 2021.

(51) Int. Cl.
*G01R 31/396* (2019.01)
*G01R 31/3835* (2019.01)
(Continued)

(52) U.S. Cl.
CPC ....... *G01R 31/396* (2019.01); *G01R 31/3835* (2019.01); *H01M 10/441* (2013.01); *H01M 10/482* (2013.01); *H02J 7/0047* (2013.01)

(58) Field of Classification Search
CPC .......................... G01R 31/396; G01R 31/3835
(Continued)

(56) References Cited

U.S. PATENT DOCUMENTS

2016/0306014 A1 10/2016 Jeon
2019/0386349 A1* 12/2019 Zeng .................. H01M 50/519
(Continued)

FOREIGN PATENT DOCUMENTS

CN 106100009 A 11/2016
CN 108400277 A 8/2018
(Continued)

OTHER PUBLICATIONS

Decision to Grant a Patent received in the corresponding Japanese Application 2023-538072, mailed on Jun. 21, 2024.
(Continued)

*Primary Examiner* — Vincent Q Nguyen
(74) *Attorney, Agent, or Firm* — Kilpatrick Townsend & Stockton LLP

(57) ABSTRACT

Method and apparatus related to battery cell sampling voltage compensation are provided. The method includes after confirming that all battery cells connected to a voltage sampling apparatus are in a normal state, charging or discharging a battery pack at a preset current to obtain sampling voltages of a plurality of battery cells using the voltage sampling apparatus. The method further includes determining, based on the obtained sampling voltages of the plurality of battery cells, a battery cell requiring sampling voltage compensation in a plurality of modules. The method further includes calculating an impedance voltage of a cross-module busbar and performing sampling voltage compensation on the battery cell requiring sampling voltage compensation based on the impedance voltage of the cross-module busbar. A position of the battery cell requiring sampling voltage compensation and the impedance of the cross-module busbar can be determined.

18 Claims, 5 Drawing Sheets

(51) Int. Cl.
*H01M 10/44* (2006.01)
*H01M 10/48* (2006.01)
*H02J 7/00* (2006.01)

(58) Field of Classification Search
USPC .......................................... 324/426, 430–435
See application file for complete search history.

(56) References Cited

U.S. PATENT DOCUMENTS

2020/0147673 A1    5/2020   Rodenburg et al.
2022/0209551 A1*   6/2022   Zhang ................. H02J 7/00308

FOREIGN PATENT DOCUMENTS

| CN | 110854334 A | 2/2020 |
| CN | 111063944 A | 4/2020 |
| CN | 111308396 A | 6/2020 |
| CN | 113067105 A | 7/2021 |
| JP | 2002334726 A | 11/2002 |
| JP | 2014157075 A | 8/2014 |
| JP | 2015057593 A | 3/2015 |
| KR | 100791215 B1 | 1/2008 |
| WO | 2011157116 A1 | 12/2011 |
| WO | 2021077813 A1 | 4/2021 |

OTHER PUBLICATIONS

The extended European search report received in the corresponding European Application 21960134.1, mailed on Mar. 7, 2024.
International Search Report received in the corresponding International Application PCT/CN2021/123018, mailed Apr. 25, 2022.
The Request for the Submission of an Opinion received in the counterpart Korean application 10-2023-7020748, mailed on Feb. 12, 2025.

* cited by examiner

BATTERY CELL SAMPLING VOLTAGE COMPENSATION METHOD AND APPARATUS AND ELECTRIC APPARATUS

CROSS-REFERENCE TO RELATED APPLICATIONS

This application is a continuation of International Application No. PCT/CN2021/123018, filed on Oct. 11, 2021 and entitled "BATTERY CELL SAMPLING VOLTAGE COMPENSATION METHOD AND APPARATUS AND ELECTRIC APPARATUS", which is incorporated herein by reference in its entirety.

TECHNICAL FIELD

This application relates to the field of batteries, and specifically to a battery cell sampling voltage compensation method and apparatus and an electric apparatus.

BACKGROUND

Replacing conventional fossil fuel vehicles with new energy vehicles has become a development tendency in the automobile industry. To satisfy power requirements of electric vehicles, lithium battery new energy vehicles need to arrange a plurality of battery cells connected in series to make an entire battery pack within a higher voltage range.

At present, battery cells of a battery pack are grouped in a manner of a plurality of battery cells forming a module and a plurality of modules forming the battery pack. Modules are connected by busbars, and spatial structure arrangement between the modules of the battery pack leads to long span length between the modules. Therefore, a long busbar is inevitably introduced during connection between the modules. Due to influence of impedance of the busbar, voltage sampling of a battery cell by a voltage sampling apparatus is affected when a current flows through the battery pack. Therefore, how sampling voltages of all battery cells in a battery pack are accurately obtained is an urgent problem to be solved.

SUMMARY

In view of the preceding problems, this application provides a battery cell sampling voltage compensation method and apparatus and an electric apparatus, so as to dynamically detect a battery cell requiring voltage compensation and compensate a sampling voltage of the battery cell requiring sampling voltage compensation based on an impedance voltage of a cross-module busbar without the need for a special device.

According to a first aspect, this application provides a battery cell sampling voltage compensation method, where a battery cell sampling voltage is measured using a voltage sampling apparatus, the voltage sampling apparatus is electrically connected to a plurality of battery cells connected in series in a battery pack, the battery pack includes a plurality of modules, each module includes a plurality of battery cells, at least one cross-module busbar connects different modules in the battery pack and is located in a sampling channel of the voltage sampling apparatus, and the method includes the following steps: after confirming that all battery cells connected to the voltage sampling apparatus are in a normal state, charging or discharging the battery pack at a preset current to obtain sampling voltages of the plurality of battery cells using the voltage sampling apparatus; determining, based on the obtained sampling voltages of the plurality of battery cells, a battery cell requiring sampling voltage compensation in the plurality of modules, and calculating an impedance voltage of the cross-module busbar; and performing sampling voltage compensation on the battery cell requiring sampling voltage compensation based on the impedance voltage of the cross-module busbar.

In technical solutions of embodiments of this application, when the battery pack is in a resting state, it is detected whether all battery cells are in the normal state. When the battery cells in the battery pack are normal, a position of the battery cell requiring sampling voltage compensation and the impedance of the cross-module busbar are determined by flowing a stable current through the battery pack to charge or discharge the battery pack, and a sampling voltage of this battery cell is compensated based on the impedance voltage of the cross-module busbar, so that the collected battery cell voltage is consistent with the actual voltage of the battery cell.

In some embodiments, the charging or discharging the battery pack at a preset current includes circulating the preset current in all battery cells in the battery pack for a predetermined period of time. By circulating the preset current in all battery cells in the battery pack for the predetermined period of time, the voltage of each battery cell in the battery pack and an average voltage of the battery cells in the module can be effectively measured, thereby allowing accurate positioning of the battery cell requiring sampling voltage compensation.

In some embodiments, the preset current is a stable value during charging or discharging.

In some embodiments, the determining a battery cell requiring sampling voltage compensation in the plurality of modules includes: calculating a difference between a sampling voltage of each battery cell in a module and an average sampling voltage of all battery cells in this module, and determining a battery cell for which the difference is greater than a first preset threshold as a battery cell requiring sampling voltage compensation.

In some embodiments, the calculating an impedance voltage of the cross-module busbar includes: calculating a difference between a sampling voltage of the battery cell requiring sampling voltage compensation and an average sampling voltage of the remaining battery cells after excluding the battery cell requiring sampling voltage compensation from the module, determining an impedance of the cross-module busbar based on the difference and the preset current, and determining an impedance voltage of the cross-module busbar based on a current flowing through the cross-module busbar and the impedance of the cross-module busbar.

In some embodiments, the method includes: recording the impedance of the cross-module busbar, and predicting a state of the cross-module busbar based on multiple records of the impedance of the cross-module busbar. When the battery pack is in continuous use, situations such as aging of a contact surface of the busbar and loosening of fixing bolts occur. By calculating and recording the impedance of the busbar multiple times, the state of the busbar under non-human-induced situations can be determined, facilitating inspection and repair of the busbar in the battery pack.

In some embodiments, the method further includes a step of determining whether a battery cell is in the normal state. With the battery pack being in a resting state, when a difference between the sampling voltage of each battery cell in the module and an average sampling voltage of all battery cells in the module is less than a second preset threshold, it is determined that all battery cells in the module are in the normal state.

In some embodiments, that the battery pack is in a resting state includes: when a SOC of the battery pack is within a preset range, a flow current of the battery pack is a resting current.

In some embodiments, the preset range for the SOC of the battery pack is between 30% and 80%.

In some embodiments, the method further includes: when all battery cells in the battery pack are in the normal state, setting a condition test flag bit of the battery pack to 1.

In some embodiments, the method includes: during use of the battery pack, when the condition test flag bit of the battery pack is 1, determining whether all battery cells in the battery pack are in the normal state, if at least one battery cell is not in the normal state, setting the condition test flag bit of the battery pack to 0 and redetecting whether all battery cells in the battery pack are in the normal state, and when it is determined that all battery cells in the battery pack are in the normal state, resetting the condition test flag bit of the battery pack to 1.

In some embodiments, all battery cells in the battery pack are battery cells of a same type.

According to a second aspect, this application provides a battery cell sampling voltage compensation apparatus including a memory and a processor, where the memory stores a computer program, and the processor is configured to: when executing the computer program, implement the foregoing battery cell sampling voltage compensation method of this application.

According to a third aspect, this application provides an electric apparatus including a battery pack and the foregoing battery cell sampling voltage compensation apparatus. The battery pack is configured to supply electrical energy.

The foregoing description is merely an overview of the technical solutions of this application. For a better understanding of the technical means in this application such that they can be implemented according to the content of the specification, and to make the above and other objectives, features and advantages of this application more obvious and easier to understand, the following describes specific embodiments of this application.

BRIEF DESCRIPTION OF DRAWINGS

Persons of ordinary skill in the art can clearly understand various other advantages and benefits by reading the detailed description of the preferred embodiments below. The accompanying drawings are merely intended to illustrate the preferred embodiments and are not intended to limit this application. In addition, in all the accompanying drawings, like reference signs denote like components. In the accompanying drawings.

DESCRIPTION OF EMBODIMENTS

Figure 1:
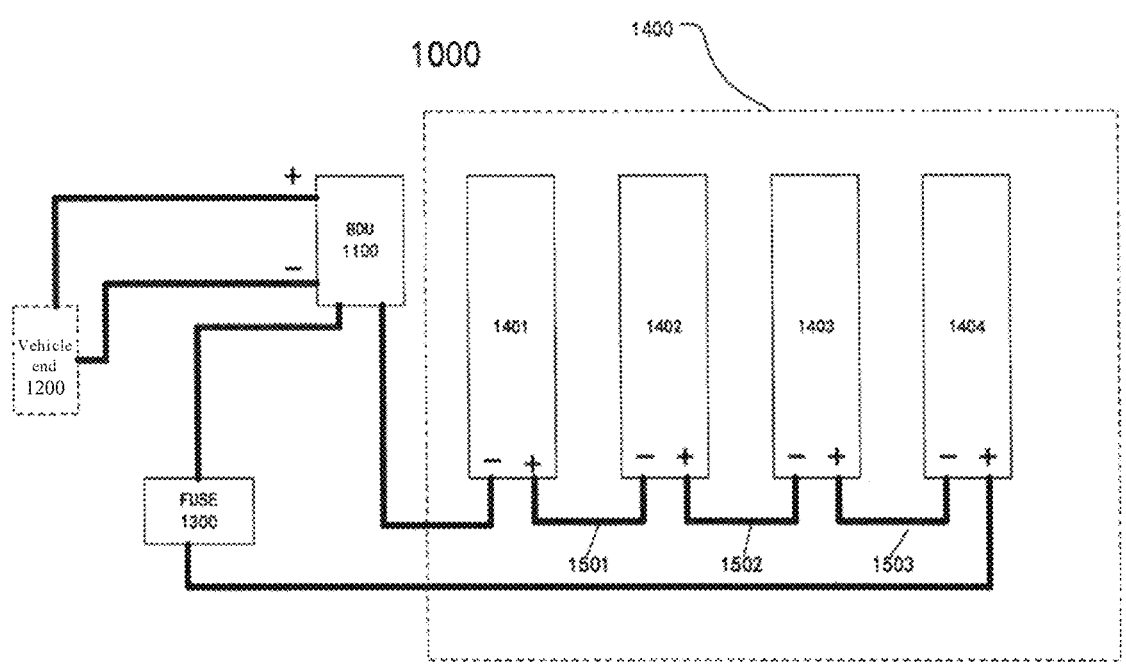
FIG. 1 is a diagram illustrating electrical connection in a battery system according to some embodiments of this application.

The following describes in detail the embodiments of technical solutions of this application with reference to the accompanying drawings. The following embodiments are merely intended for a clearer description of the technical solutions of this application and therefore are merely used as examples which do not constitute any limitations on the protection scope of this application.

Unless otherwise defined, all technical and scientific terms used herein shall have the same meanings as commonly understood by those skilled in the art to which this application relates. The terms used herein are intended to merely describe the specific embodiments rather than to limit this application. The terms "include", "comprise", and "have" and any other variations thereof in the specification, claims and brief description of drawings of this application are intended to cover non-exclusive inclusions.

In the description of the embodiments of this application, the terms "first", "second" and the like are merely intended to distinguish between different objects, and shall not be understood as any indication or implication of relative importance or any implicit indication of the number, sequence or primary-secondary relationship of the technical features indicated. In the description of this application, "a plurality of" means at least two unless otherwise specifically stated.

In this specification, reference to "embodiment" means that specific features, structures or characteristics described with reference to the embodiment may be incorporated in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of the embodiments of this application, the term "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between contextually associated objects.

In the description of the embodiments of this application, the term "a plurality of" means more than two (inclusive). Similarly, "a plurality of groups" means more than two (inclusive) groups, and "a plurality of pieces" means more than two (inclusive) pieces.

In the description of the embodiments of this application, the orientations or positional relationships indicated by the technical terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", "axial", "radial", "circumferential", and the like are based on the orientations or positional relationships as shown in the accompanying drawings. These terms are merely for the ease and brevity of description of the embodiments of this application rather than indicating or implying that the apparatuses or components mentioned must have specific orientations or must be constructed or manipulated according to specific orientations, and therefore shall not be construed as any limitations on the embodiments of this application.

In the description of the embodiments of this application, unless otherwise specified and defined explicitly, the terms "mount", "connect", "join", and "fasten" should be understood in their general senses. For example, they may refer to a fixed connection, a detachable connection, or an integral connection, may refer to a mechanical connection or electrical connection, and may refer to a direct connection, an indirect connection via an intermediate medium, or an interaction between two elements. Persons of ordinary skill in the art can understand specific meanings of these terms in this application as appropriate to specific situations.

A traction battery is a battery that provides a power source for an electric apparatus. Optionally, the traction battery may be a rechargeable traction battery. In terms of categories, the traction battery may be a lithium-ion battery, a lithium metal battery, a lead-acid battery, a nickel-cadmium battery, a nickel-metal hydride battery, a lithium-sulfur battery, a lithium-air battery, a sodium-ion battery, or the like. This is not specifically limited in the embodiments of this application. In terms of scale, the battery in the embodiments of this application may be a battery cell, or may be a battery module or a battery pack. This is not specifically limited in the embodiments of this application. Optionally, the electric apparatus may be a vehicle, a ship, or a spacecraft. This is not specifically limited in the embodiments of this application. A battery management system (Battery Management System, BMS) of the traction battery is a control system that protects use safety of the traction battery and implements functions such as charge/discharge management, high voltage control, battery protection, battery data collection, and battery status evaluation.

At present, battery cells of a traction battery are typically grouped in a manner of a plurality of battery cells forming a module and a plurality of modules forming a battery pack. Modules in the battery pack are connected by busbars (busbar). The busbar is formed as a bar or strip made of a metal conductor and is connected to an electrode in the modules in the battery pack in a manner of screw connection or the like. During connection of the modules in the battery pack, long span length is present between some modules, and therefore a long busbar is inevitably introduced during grouping. If a position of a cross-module busbar is right in a sampling channel of a voltage sampling apparatus, due to influence of impedance of the busbar, voltage sampling of a battery cell by the voltage sampling apparatus is affected when a current flows through the battery pack. A voltage sampling channel is a channel between two sampling terminals of the voltage sampling apparatus. For example, when sampling a battery cell in the battery pack, one sampling terminal of the voltage sampling apparatus performs voltage sampling on a positive electrode of the battery, and the other sampling terminal performs voltage sampling on a negative electrode of the battery. A channel formed between each of the two sampling terminals of the sampling apparatus and the sampling apparatus is the sampling channel.

In view of inaccurate battery cell sampling voltage caused by a cross-module busbar at present, there are already two dealing methods. The first method is as follows: Test impedance of busbars between modules during assembly of a battery pack; and when making a specific adjustment policy in management software of a battery management system, compensate a voltage of a battery cell based on a current, to be specific, calculate a voltage of the busbar using Ohm's law to perform voltage compensation on the battery cell. Disadvantages of the first method are as follows: the impedance of the busbar may increase in a later period of a life cycle of the battery pack, and data at begin of life BOL (Begin of Life) cannot reflect a state at end of life EOL (End of Life), leading to inaccurate compensation data of battery cell sampling voltage in the later period; and in addition, performing impedance testing of busbars for each battery pack and writing data into the management software take up a lot of working hours. The second method is as follows: Some voltage sampling apparatuses (for example, sampling chips which may be analog front end AFE (Analog Front End) chips, to be specific, the analog front end chips complete the sampling function for the battery pack) support voltage collection of busbars, and sampling wire harnesses are added at both ends of the busbar to the sampling chip (or dedicated ports are reserved in the sampling chip) so that a voltage of the busbar is collected inside the sampling chips and then directly compensated to a voltage of a corresponding battery cell. Disadvantages of the second method are as follows: the sampling chip requires more wire harness interface resources support, and the sampling chip can use only a chip that supports a wire harness interface function. The second method features higher requirements for the voltage sampling chip.

In view of the foregoing situation, embodiments of the present invention provide a battery cell sampling voltage compensation method and apparatus and an electric apparatus. Whether all battery cells are normal is detected when a battery is in a resting state; then the battery cells are charged or discharged by flowing a stable current to determine a position of a battery cell requiring sampling voltage compensation and an impedance of a cross-module busbar, so as to compensate a voltage of the battery cell at that position collected by a voltage sampling apparatus. This makes the collected battery cell voltage be consistent with the actual voltage of the battery cell. The above measurement and operation ensure that, during determining of battery cell overvoltage/undervoltage faults of the battery, the collected battery cell voltage is the actual voltage of the battery cell.

For ease of description, a battery system 1000 of an embodiment of the application is used as an example for description of the following embodiments.

As shown in FIG. 1, FIG. 1 is a diagram illustrating electrical connection in a battery system according to some embodiments of this application.

As shown in FIG. 1, in the figure, the battery system 1000 includes a high-voltage control box BDU 1100, a high-voltage fuse FUSE 1300, a vehicle end 1200, and a battery pack 1400. The battery pack 1400 includes four modules: 1401, 1402, 1403, and 1404, and the modules are connected by busbars, where a busbar 1501 connects the module 1401 and the module 1402, a busbar 1502 connects the module 1402 and the module 1403, and the busbar 1503 connects the module 1403 and the module 1404. Each module of the battery pack 1400 includes a plurality of battery cells connected in series. For example, each of the modules 1401, 1402, 1403, and 1404 may include 8 battery cells connected in series. The high-voltage control box BDU 1100 is formed by a high-voltage relay inside for controlling shutdown of a high-voltage loop of the entire battery pack. The high-voltage fuse FUSE 1300 is configured to disconnect the high-voltage loop in case of extreme operating conditions such as short circuit. The modules in the battery pack is connected to the vehicle end 1200 via the BDU 1100 and the FUSE 1300 to supply power to the vehicle.

According to one or more embodiments of the present invention, the battery pack in FIG. 1 may include a plurality of modules but is not limited to the four modules shown in FIG. 1, each module may also include a plurality of battery cells connected in series, and the numbers of battery cells in all the modules may be the same or different.

Figure 2:
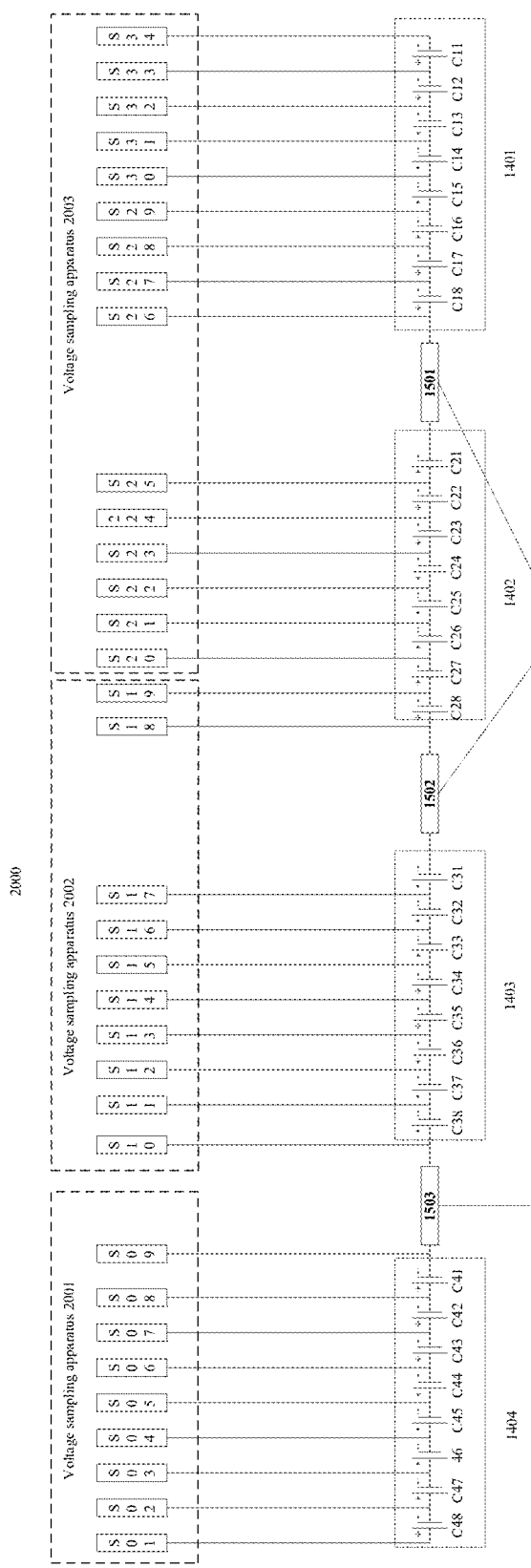
FIG. 2 is a schematic diagram of how a voltage sampling apparatus is connected to each battery cell in a battery pack with a cross-module busbar according to some embodiments of this application.

FIG. 2 is a schematic diagram 2000 of how a voltage sampling apparatus is connected to each battery cell in a battery pack with a cross-module busbar according to some embodiments of this application.

As shown in FIG. 2, the FIG. 2000 is a figure of a connection manner of a battery pack 1400 including cross-module busbars and voltage sampling apparatuses. The FIG. 2000 includes a voltage sampling apparatus 2001, a voltage sampling apparatus 2002, and a voltage sampling apparatus 2003. The voltage sampling apparatuses 2001, 2002, and 2003 may be AFE chips and separately perform sampling on battery cells in modules 1401, 1402, 1403, and 1404 of the battery pack. The voltage sampling apparatus 2001 has sampling terminals S01 to S09, the voltage sampling apparatus 2002 has sampling terminals S10 to S19, and the voltage sampling apparatus 2003 has sampling terminals S20 to S34. The module 1401 includes battery cells C11 to C18, the module 1402 includes battery cells C22 to C28, the module 1403 includes battery cells C31 to C38, and the module 1404 includes battery cells C41 to C48. A busbar 1501 is located between the modules 1401 and 1402, a busbar 1502 is located between the modules 1402 and 1403, and a busbar 1503 is located between the modules 1403 and 1404. The voltage sampling apparatus 2001, the voltage sampling apparatus 2002, and the voltage sampling apparatus 2003 collect voltages between positive and negative terminals of the battery cells in the modules 1401, 1402, 1403, and 1404 via sampling terminals and calculate differences to obtain sampling voltages of the battery cells. For example, the voltage sampling apparatus 2001 collects a sampling voltage of the battery cell C48 via sampling terminals S01 and S02. To be specific, the sampling voltage of the battery cell C48 is: the sampling voltage obtained from a positive electrode of C48 via the sampling terminal S01 minus the sampling voltage obtained from a negative electrode of the battery cell C48 via the sampling terminal S02. A sampling channel of the voltage sampling apparatus 2001 for the battery cell C48 is from the positive electrode of C48 to which the sampling terminal S01 is connected to the negative electrode of C48 to which the sampling terminal S02 is connected.

According to one or more embodiments of the present invention, as shown in FIG. 2, a busbar 1503 is located between a sampling terminal S09 of the voltage sampling apparatus 2001 and a sampling terminal S10 of the voltage sampling apparatus 2002. As the busbar 1503 is located between two different voltage sampling apparatuses 2001 and 2002, voltages of the battery cells in the module 1404 can be directly obtained from voltages from the sampling terminals S01 to S09 and the sampling voltage at the sampling terminal S10. The sampling voltages of all the battery cells in the module 1404 can be accurately obtained from the sampling voltages at all sampling terminals of the voltage sampling apparatus 2001 and at the sampling terminal S10 of the voltage sampling apparatus 2002, therefore no battery cell in the module 1404 requires sampling voltage compensation. In addition, a busbar 1502 is located between the modules 1403 and 1402, and the busbar 1502 is located between sampling terminals S17 and S18 of the voltage sampling apparatus 2002, that is, located in a sampling channel formed by the voltage sampling apparatus 2002 and the sampling terminal S17 and the sampling terminal S18. To obtain sampling voltages of the battery cells in the modules 1403 and 1402, it is necessary to calculate an impedance voltage of the busbar 1502 to compensate a sampling voltage of a battery cell. For example, with a discharge current circulating in the battery pack, when obtaining the voltage of the battery cell C31, it is necessary to take the impedance voltage of the busbar 1502 into account, to be specific, the actual voltage of the battery cell C31 is: (sampling voltage at sampling terminal S17−sampling voltage at sampling terminal S18)+(impedance of busbar 1502\*current flowing through busbar 1502). Therefore, the busbar 1502 is a cross-module busbar, and the impedance voltage of the cross-module busbar 1502 (that is, impedance of busbar 1502\*current flowing through busbar 1502) is obtained to compensate a sampling voltage of the battery cell C31, so as to obtain the actual voltage of the battery cell C31. For example, when a charge current is circulating in the battery pack, the above calculation for the actual voltage of C31 is: (sampling voltage at sampling terminal S17−sampling voltage at sampling terminal S18)−(impedance of busbar 1502\*current flowing through busbar 1502). Similarly, a busbar 1501 is located between sampling terminals S25 and S26 of the voltage sampling apparatus 2003. When obtaining sampling voltages of the battery cells in the busbars 1501 and 1502, it is necessary to calculate an impedance voltage of the busbar 1501 and to compensate a sampling voltage of a battery cell in the module 1401.

Figure 3:
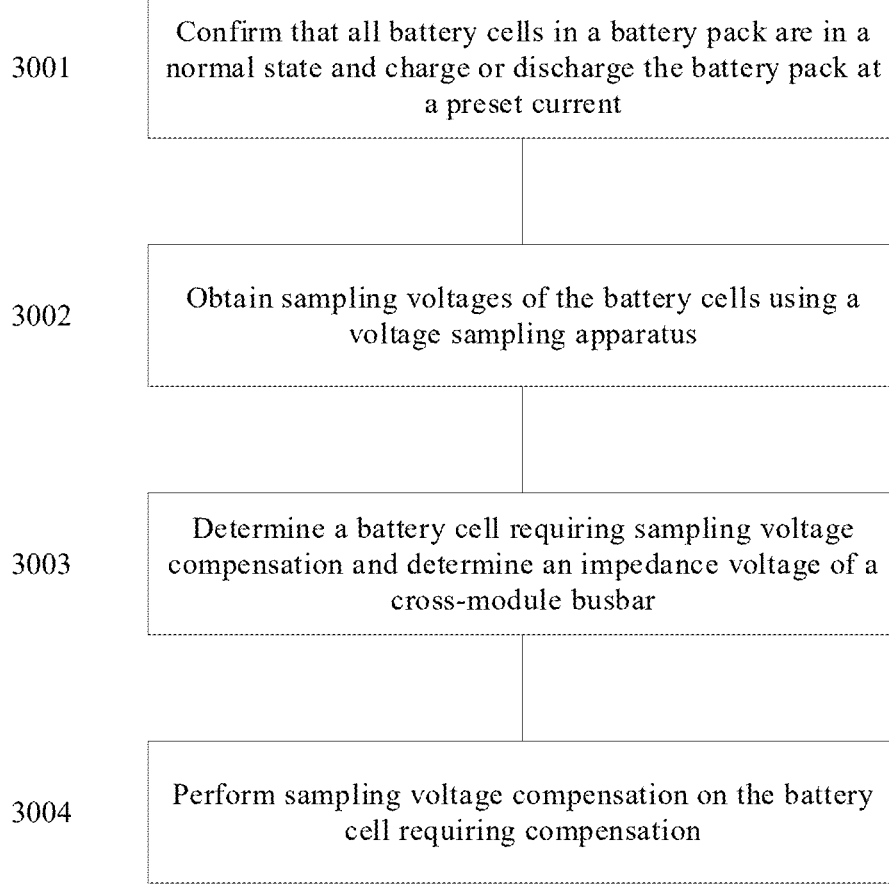
FIG. 3 is a flowchart of a battery cell sampling voltage compensation scheme according to some embodiments of this application.

FIG. 3 is a flowchart 3000 of a battery cell sampling voltage compensation scheme according to some embodiments of this application.

As shown in FIGS. 1 to 3, according to the arrangement structure of the battery cells, busbars, and voltage sampling apparatuses in the battery system of FIGS. 1 and 2, sampling voltages of the battery cells (for example, C11 to C18) in the modules (for example, modules 1401 to 1404) in the battery pack (for example, the battery pack 1400) are measured using the voltage sampling apparatuses (for example, the voltage sampling apparatus 2001, the voltage sampling apparatus 2002, and the voltage sampling apparatus 2003). As shown in FIG. 2, the voltage sampling apparatuses (for example, 2001, the voltage sampling apparatus 2002, and the voltage sampling apparatus 2003) are electrically connected, via sampling terminals (for example, S01 to S34), to the battery cells (for example, C11 to C48) connected in series in the battery pack (for example, the battery pack 1400), where the battery pack includes a plurality of modules (for example, the battery pack 1400 includes the modules 1401, 1402, 1403, and 1404), each module (for example, 1401, 1402, 1403, and 1404) includes a plurality of battery cells (C11 to C48), and cross-module busbars (for example, the busbar 1501 or 1502) connect different modules in the battery pack (to be specific, the cross-module busbar 1501 connects the modules 1401 and 1402, and the cross-module busbar 1502 connects the modules 1402 and 1403), and the cross-module busbars (for example, the busbar 1501) are located in the sampling channels of the voltage sampling apparatuses (for example, the voltage sampling apparatus 2003). For example, the busbar 1501 is located in the sampling channel formed by the voltage sampling apparatus 2003 and the sampling terminals S25 and S26, and the cross-module busbar 1502 is located in the sampling channel of the voltage sampling apparatus 2002, that is, in the sampling channel formed by the voltage sampling apparatus 2002, and the sampling terminals S17 and S18.

According to one or more embodiments of the present invention, the flowchart 3000 of a battery cell sampling voltage compensation scheme includes the following steps.

3001. After confirming that all battery cells (for example, C11 to C48) connected to the voltage sampling apparatus (for example, the voltage sampling apparatuses 2001, 2002, and 2003) are in a normal state, charge or discharge the battery pack (for example, the battery pack 1400) at a preset current I.

3002. Obtain sampling voltages of the battery cells (for example, C11 to C48) using the voltage sampling apparatus (for example, the voltage sampling apparatuses 2001, 2002, and 2003).

3003. Determine, based on the obtained sampling voltages of the battery cells (for example, C11 to C48), a battery cell (for example, C31 or C21 in FIG. 2) requiring sampling voltage compensation in the modules (the module 1401 or 1402), and calculate an impedance voltage of the cross-module busbar (for example, 1501 or 1502).

3004. Perform sampling voltage compensation on the battery cell (for example, C31 or C21) requiring voltage compensation based on the impedance voltage of the cross-module busbar (for example, 1501 or 1502).

By determining whether all battery cells in the module in the battery pack are normal, and then charging or discharging the battery pack at the stable current I, the battery cell requiring sampling voltage compensation in the module can be positioned. Sampling voltage compensation is performed on the battery cell requiring sampling voltage compensation by determining the impedance of the cross-module busbar and the impedance voltage thereof so that the battery cell voltage collected by the sampling apparatus is consistent with the actual voltage of the battery cell.

According to one or more embodiments of the present invention, the battery cells in the battery pack (for example, the battery pack 1400) are charged or discharged by circulating a stable current in all battery cells (for example, the battery cells C11 to C48) in the battery pack (for example, the battery pack 1400) for a predetermined period of time Ts. The preset current I and the duration Ts need to be determined based on characteristics of the battery cell. Generally, the preset current I is sufficient to satisfy more than one times the battery cell power. During actual measurement, the preset current I needs to be specifically determined based on different characteristics of the battery cell.

Flowing of a large current, for example, more than one times the battery cell power, can expose influence of the busbar in the module on voltage. The set period of time Ts allows full polarization of the battery cell, leading to more stable polarization between the battery cells.

According to one or more embodiments of the present invention, the preset current I may be set to be greater than a current flowing through the battery pack for 1c charging/discharging of a battery cell.

The preset current I may be set to be greater than a current for 1c charging/discharging of a battery cell in the battery pack, and the current for 1c charging/discharging of a capacity of a battery cell is a current for the battery cell to be fully charged or fully discharged in 1 hour. For example, the battery cell in the battery pack has a capacity of 200 AH, and then I can be set to be greater than or equal to 200 A. In addition, I needs to be stable during testing. For example, depending on the capacity of the battery cell, I may be stable at 300 A or 350 A. During actual measurement, generally, Ts is about 10 s.

If the above condition for charging/discharging current is satisfied, the battery cell requiring sampling voltage compensation can be positioned and the influence of the cross-module busbar on the sampling voltage can be calculated.

According to one or more embodiments of the present invention, the preset current I is a stable current, and setting of a stable current facilitates accurate measurement of the sampling voltages of all battery cells using the voltage sampling apparatus during measurement.

According to one or more embodiments of the present invention, when compensation is performed on a battery cell requiring sampling voltage compensation in a module (for example, the module 1401 and module 1402), it is necessary to calculate a difference between a sampling voltage of each battery cell in a module and an average sampling voltage of all battery cells in this module, and a battery cell for which the difference is greater than a preset threshold is determined as a battery cell requiring sampling voltage compensation.

Specifically, for example, when the battery pack (for example, the battery pack 1400) is charged or discharged at the preset stable current I, an average voltage Vavg1 of all battery cells in a same module (for example, the module 1401 or 1402) of the battery pack is calculated, a voltage Vcelln (n indicating the n-th cell in the module and n starting at 1) of each battery cell in the module is calculated based on a voltage at a sampling terminal (or sampling point) of the voltage sampling apparatus, and a voltage difference $\Delta V1$ between Vcelln and an average sampling voltage Vavg1 of the battery cells in the module is calculated to determine whether $\Delta V1$ satisfies $\Delta V1 > Y$ (mv), where Y is a first threshold, and a battery cell satisfying this condition is considered to be the battery cell requiring sampling voltage compensation. $\Delta V1 > Y$ (mv) indicates that the n-th battery cell in the module requires sampling voltage compensation, where Y is a preset threshold based on experimental tests, $Y = I*R$, and R is an impedance obtained based on experimental test data, for example, R may be set to 0.05 m$\Omega$.

With the above calculation method, the battery cell requiring sampling voltage compensation can be accurately positioned, and the impedance of the cross-module busbar can be accurately obtained, so that the sampling voltage at the cross-module busbar can be more effectively obtained.

After the battery cell requiring sampling voltage compensation is determined, a difference between a sampling voltage of the battery cell requiring sampling voltage compensation and an average sampling voltage of the remaining battery cells after excluding the battery cell requiring sampling voltage compensation from the module is calculated, an impedance of the cross-module busbar $R_{busbar}$ is determined based on the difference and the preset current, and an impedance voltage of the cross-module busbar is determined based on a current flowing through the cross-module busbar and the impedance of the cross-module busbar $R_{busbar}$.

Specifically, the method for calculating the impedance of the cross-module busbar $R_{busbar}$ (m$\Omega$) at the battery cell requiring sampling voltage compensation is: calculating an average sampling voltage Vavg2 of the remaining battery cells after excluding the battery cell requiring sampling voltage compensation from the module, calculating a voltage difference $\Delta V2$ between a sampling voltage of the battery cell requiring sampling voltage compensation and the Vavg2, and calculating the impedance of the cross-module busbar $R_{busbar}$ based on $\Delta V2$, where $R_{busbar} = \Delta V2/I$. In addition, according to Ohm's law, the impedance voltage of the cross-module busbar is determined based on a current flowing through the busbar and the impedance of the cross-module busbar $R_{busbar}$, and the impedance voltage is used for compensating the sampling voltage of the battery cell requiring sampling voltage compensation. The purpose of calculating the voltage difference is to remove the battery cell voltage to be compensated to avoid introduction of busbar errors.

During the above calculation, the battery cell requiring sampling voltage compensation needs to be excluded from the module, the purpose of which is to more accurately calculate the average sampling voltage of the module, so as to determine the voltage difference ΔV2, thereby removing the battery cell voltage to be compensated to avoid introduction of busbar voltage errors.

According to one or more embodiments of the present invention, the impedance of the cross-module busbar $R_{busbar}$ is recorded, and a state of the cross-module busbar is predicted based on multiple records of the impedance of the cross-module busbar.

For example, software of a battery management system can be used to record each calculated impedance of the cross-module busbar, compare the recorded impedance of the cross-module busbar to determine whether there is a trend of increasing, and then predict a state of the busbar. Generally, the state of the busbar may be aging of a busbar body and a contact surface of the busbar, loosening of fixing bolts, and the like. In addition, loosening of fixing bolts of the busbar leads to increased resistance. Since loosening of fixing bolts is a slow change process under non-human-induced operation, with multiple collections of the impedance of the busbar, the state of the busbar can be detected.

According to one or more embodiments of the present invention, a process of determining whether a battery cell in the battery pack is in the normal state is: with the battery pack being in a resting state, when a difference between the sampling voltage of each battery cell in the module and an average sampling voltage of all battery cells in the module is less than a preset threshold, it is determined that all battery cells in the module are in the normal state.

Specifically, with the battery pack being in a resting state for a period of time, for example, 0.5 hours, when the battery pack is used for the first time, a voltage difference ΔV3 between the sampling voltage of each battery cell in the module in the battery pack and an average sampling voltage Vavg3 of all battery cells in the module is calculated, and it is determined whether V3<X (mv) holds, where X is a preset threshold, and X is a voltage difference for determining whether a battery cell is normal based on characteristics of the battery cell in the battery pack. This preset threshold X can be used to filter out an abnormal voltage of a battery cell in the battery pack in the resting state. Usually, during actual measurement, X may generally be set to 50 (mv), which is specifically determined based on different characteristics of the battery cell.

Determining whether a battery cell in the battery pack in the resting state is in the normal state can ensure accurate positioning of the battery cell requiring sampling voltage compensation. If a battery cell in the battery pack is in an abnormal state, the battery cell in the abnormal state in the battery pack leads to inaccurate sampling voltage.

According to one or more embodiments of the present invention, when a SOC of the battery pack is within a preset range, the battery pack is kept in a resting state, and the resting state means that a current flowing through the battery pack is a resting current, where the resting current is usually a small current.

The battery pack being kept in a resting state means no current or small current, ensuring subsiding of polarization of the battery cell caused by current. The voltage at this point is a normal static voltage.

According to one or more embodiments of the present invention, the resting current is less than 5 A.

5 A means a small static current. By setting the current to 5 A, a normal static voltage can be obtained, conducive to determining of the normal state of the battery cell.

According to one or more embodiments of the present invention, the SOC of the battery pack falls between 30% and 80%, keeping the battery pack in the resting state.

The SOC of the battery pack being kept within the fixed above range is to ensure that the battery pack is under normal operating conditions when it is detected whether the battery cell is in the normal state.

According to one or more embodiments of the present invention, when all battery cells in the battery pack are in the normal state, a battery management system sets a condition test flag bit of the battery pack to 1. Generally, the condition test flag of the battery pack is set in software of the battery management system.

The purpose of setting the condition test flag is to allow the battery management system to directly determine a state of a battery cell by detecting or setting the flag bit during operations on the battery cell of the battery pack, facilitating subsequent battery management operations.

During use of the battery pack, when detecting that the condition test flag bit of the battery pack is 1, the battery management system performs the following steps: determining whether all battery cells in the battery pack are in the normal state, if at least one battery cell is not in the normal state, setting the condition test flag bit of the battery pack to 0 and redetecting whether all battery cells in the battery pack are in the normal state, and when determining that all battery cells in the battery pack are in the normal state, resetting the condition test flag bit of the battery pack to 1. When all battery cells in the battery pack are in the normal state, impedance measurement and calculation of the cross-module busbar can be started.

Detecting the condition test flag bit in the battery pack during use and detecting whether the battery cells are in the normal state make the battery management system safer and more reliable during subsequent operations using the battery pack.

According to one or more embodiments of the present invention, all battery cells in the modules in the battery pack are battery cells of a same type.

When the battery cells in the modules in the battery pack are battery cells of a same type, calculation of battery cell sampling voltage mentioned above is more convenient and the threshold setting is also more reasonable.

Table 1 shows measured data of a battery pack according to a battery cell voltage compensation scheme.

Figure 4:
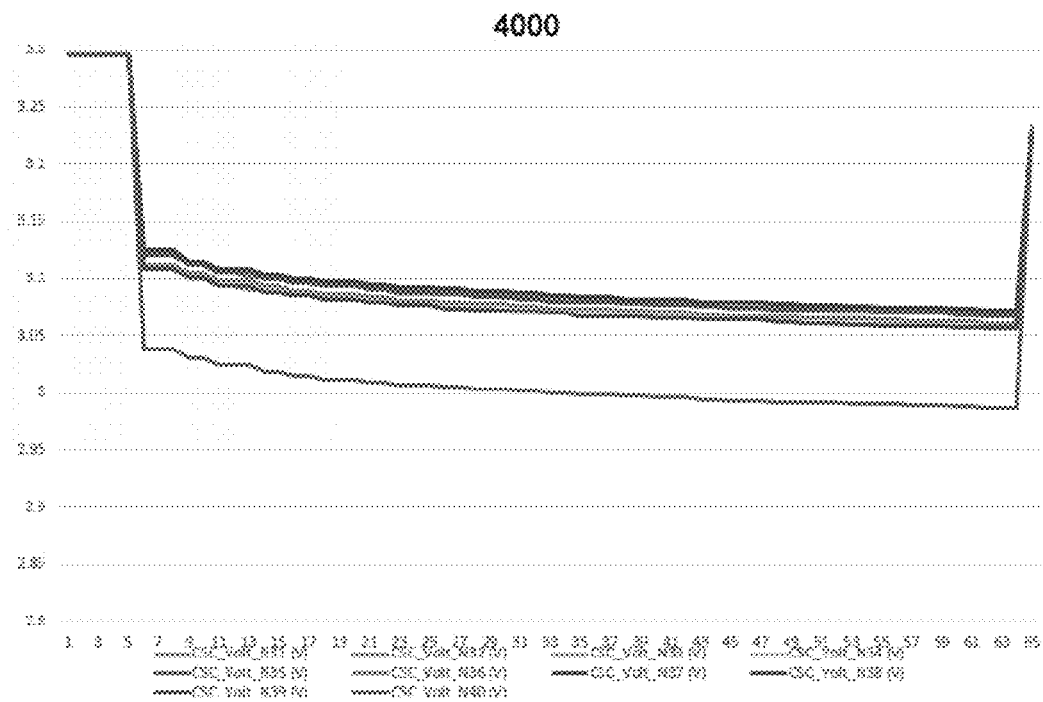
FIG. 4 is a diagram illustrating changing of battery cell sampling voltages with time in measured data according to some embodiments of this application.

Table 1 shows sampling voltages changing with time of the battery pack in an actual test, with battery cells N31 to N40 as an example. The table also includes a voltage, current, and maximum and minimum battery cell voltages of the battery pack, and SOC of a battery. FIG. 4 also shows a FIG. 4000 illustrating changing of battery cell sampling voltages with time in measured data.

As shown in Table 1, with the battery pack being in a resting state, battery cell voltages in the battery pack (as shown in row 174 on the left side of the table in Table 1) are all at a stable level, and a difference between the voltage of each battery cell and an average voltage Vavg1 (Vavg1=3295.8 mv, which is an average value of sampling voltages of the battery cells N31 to N40 in row 174 of Table 1) of all battery cells in a module in the battery pack is less than 50 mv. A testing condition for determining a battery cell requiring sampling voltage compensation when all battery cells are in a normal state is satisfied, in which case a condition test flag bit of the battery pack is set to 1. The number 1 in column 1 of Table 1 indicates the flag designed inside power management software, and the flag bit is set to 1 when voltage consistency of the battery cells in the resting state is high, indicating that correction can be triggered.

TABLE 1

Measured data of battery pack according to battery cell voltage compensation scheme

| Data Time | Voltage (V) of battery pack | Current (I) of battery pack | Maximum voltage (V) of battery cell | Maximum current (I) of battery cell | SOC (%) displayed | CSC_Volt_N 31 (V) | CSC_Volt_N 32 (V) | CSC_Volt_N 33 (V) | CSC_Volt_N 34 (V) |
|---|---|---|---|---|---|---|---|---|---|
| 3:15:28:870 | 373.4 | 400.5 | 3.299 | 3.295 | 41 | 3.296 | 3.296 | 3.296 | 3.297 |
| 3:15:29:088 | 372.6 | 400.6 | 3.147 | 3.05 | 41 | 3.296 | 3.296 | 3.296 | 3.297 |
| 3:15:29:299 | 372.1 | 400.6 | 3.14 | 3.043 | 41 | 3.121 | 3.109 | 3.123 | 3.111 |
| 3:15:29:503 | 371.6 | 400.6 | 3.134 | 3.035 | 41 | 3.121 | 3.109 | 3.123 | 3.111 |
| 3:15:29:706 | 371.3 | 400.6 | 3.131 | 3.033 | 41 | 3.121 | 3.109 | 3.123 | 3.111 |
| 3:15:29:909 | 371.1 | 400.7 | 3.127 | 3.029 | 41 | 3.112 | 3.1 | 3.115 | 3.103 |
| 3:15:30:112 | 370.9 | 400.6 | 3.125 | 3.027 | 41 | 3.112 | 3.1 | 3.115 | 3.103 |
| 3:15:30:324 | 370.8 | 400.6 | 3.121 | 3.022 | 40.5 | 3.105 | 3.093 | 3.108 | 3.097 |
| 3:15:30:527 | 370.4 | 400.6 | 3.12 | 3.022 | 40.5 | 3.105 | 3.093 | 3.108 | 3.097 |
| 3:15:30:730 | 370.3 | 400.6 | 3.117 | 3.019 | 40.5 | 3.101 | 3.09 | 3.108 | 3.097 |
| 3:15:30:933 | 370.1 | 400.6 | 3.117 | 3.018 | 40.5 | 3.101 | 3.09 | 3.103 | 3.092 |
| 3:15:31:143 | 370 | 400.6 | 3.116 | 3.016 | 40.5 | 3.101 | 3.09 | 3.103 | 3.092 |
| 3:15:31:346 | 369.8 | 400.6 | 3.114 | 3.015 | 40.5 | 3.096 | 3.085 | 3.099 | 3.089 |
| 3:15:31:549 | 369.6 | 400.7 | 3.113 | 3.014 | 40.5 | 3.096 | 3.085 | 3.099 | 3.089 |
| 3:15:31:752 | 369.6 | 400.6 | 3.112 | 3.013 | 40.5 | 3.093 | 3.082 | 3.096 | 3.085 |
| 3:15:31:955 | 369.5 | 400.5 | 3.111 | 3.011 | 40.5 | 3.093 | 3.082 | 3.096 | 3.085 |
| 3:15:32:156 | 369.3 | 400.5 | 3.11 | 3.011 | 40.5 | 3.093 | 3.082 | 3.096 | 3.085 |
| 3:15:32:369 | 369.3 | 400.6 | 3.109 | 3.009 | 40.5 | 3.09 | 3.079 | 3.093 | 3.083 |
| 3:15:32:572 | 369.1 | 400.6 | 3.107 | 3.008 | 40.5 | 3.09 | 3.079 | 3.093 | 3.083 |
| 3:15:32:791 | 369 | 400.6 | 3.107 | 3.007 | 40.5 | 3.087 | 3.077 | 3.091 | 3.081 |
| 3:15:32:994 | 369 | 400.5 | 3.106 | 3.006 | 40.5 | 3.087 | 3.077 | 3.091 | 3.081 |
| 3:15:33:205 | 368.8 | 400.6 | 3.105 | 3.006 | 40.5 | 3.087 | 3.077 | 3.091 | 3.081 |
| 3:15:33:409 | 368.8 | 400.6 | 3.105 | 3.005 | 40.5 | 3.087 | 3.075 | 3.09 | 3.078 |
| 3:15:33:612 | 368.7 | 400.6 | 3.104 | 3.004 | 40.5 | 3.087 | 3.075 | 3.09 | 3.078 |
| 3:15:33:815 | 368.7 | 400.6 | 3.103 | 3.003 | 40.5 | 3.085 | 3.074 | 3.087 | 3.077 |
| 3:15:34:018 | 368.5 | 400.6 | 3.103 | 3.003 | 40.5 | 3.085 | 3.074 | 3.087 | 3.077 |
| 3:15:34:230 | 368.3 | 400.6 | 3.101 | 3.002 | 40.5 | 3.083 | 3.072 | 3.087 | 3.077 |
| 3:15:34:433 | 368.3 | 400.6 | 3.101 | 3.001 | 40.5 | 3.083 | 3.072 | 3.086 | 3.075 |
| 3:15:34:636 | 368.3 | 400.5 | 3.1 | 3 | 40.5 | 3.083 | 3.072 | 3.086 | 3.075 |
| 3:15:34:839 | 368.2 | 400.6 | 3.1 | 3 | 40.5 | 3.081 | 3.07 | 3.085 | 3.074 |
| 3:15:35:042 | 368.2 | 400.6 | 3.099 | 3 | 40.5 | 3.081 | 3.07 | 3.085 | 3.074 |

| Data Time | CSC_Volt_N 35 (V) | CSC_Volt_N 36 (V) | CSC_Volt_N 37 (V) | CSC_Volt_N 38 (V) | CSC_Volt_N 39 (V) | CSC_Volt_N 40 (V) |
|---|---|---|---|---|---|---|
| 3:15:28:870 | 3.296 | 3.296 | 3.295 | 3.296 | 3.296 | 3.295 |
| 3:15:29:088 | 3.296 | 3.296 | 3.295 | 3.296 | 3.296 | 3.295 |
| 3:15:29:299 | 3.123 | 3.112 | 3.125 | 3.109 | 3.12 | 3.039 |
| 3:15:29:503 | 3.123 | 3.112 | 3.125 | 3.109 | 3.12 | 3.039 |
| 3:15:29:706 | 3.123 | 3.112 | 3.125 | 3.109 | 3.12 | 3.039 |
| 3:15:29:909 | 3.115 | 3.105 | 3.115 | 3.101 | 3.112 | 3.03 |
| 3:15:30:112 | 3.115 | 3.105 | 3.115 | 3.101 | 3.112 | 3.03 |
| 3:15:30:324 | 3.108 | 3.098 | 3.109 | 3.094 | 3.105 | 3.024 |
| 3:15:30:527 | 3.108 | 3.098 | 3.109 | 3.094 | 3.105 | 3.024 |
| 3:15:30:730 | 3.108 | 3.098 | 3.109 | 3.094 | 3.105 | 3.024 |
| 3:15:30:933 | 3.103 | 3.094 | 3.104 | 3.088 | 3.1 | 3.019 |
| 3:15:31:143 | 3.103 | 3.094 | 3.104 | 3.088 | 3.1 | 3.019 |
| 3:15:31:346 | 3.1 | 3.089 | 3.1 | 3.085 | 3.096 | 3.015 |
| 3:15:31:549 | 3.1 | 3.089 | 3.1 | 3.085 | 3.096 | 3.015 |
| 3:15:31:752 | 3.097 | 3.087 | 3.097 | 3.082 | 3.093 | 3.012 |
| 3:15:31:955 | 3.097 | 3.087 | 3.097 | 3.082 | 3.093 | 3.012 |
| 3:15:32:156 | 3.097 | 3.087 | 3.097 | 3.082 | 3.093 | 3.012 |
| 3:15:32:369 | 3.094 | 3.084 | 3.095 | 3.079 | 3.091 | 3.009 |
| 3:15:32:572 | 3.094 | 3.084 | 3.095 | 3.079 | 3.091 | 3.009 |
| 3:15:32:791 | 3.091 | 3.081 | 3.092 | 3.077 | 3.088 | 3.007 |
| 3:15:32:994 | 3.091 | 3.081 | 3.092 | 3.077 | 3.088 | 3.007 |
| 3:15:33:205 | 3.091 | 3.081 | 3.092 | 3.077 | 3.088 | 3.007 |
| 3:15:33:409 | 3.089 | 3.08 | 3.091 | 3.074 | 3.086 | 3.006 |
| 3:15:33:612 | 3.089 | 3.08 | 3.091 | 3.074 | 3.086 | 3.006 |
| 3:15:33:815 | 3.088 | 3.078 | 3.089 | 3.073 | 3.084 | 3.003 |
| 3:15:34:018 | 3.088 | 3.078 | 3.089 | 3.073 | 3.084 | 3.003 |
| 3:15:34:230 | 3.088 | 3.078 | 3.089 | 3.073 | 3.084 | 3.003 |
| 3:15:34:433 | 3.085 | 3.076 | 3.088 | 3.071 | 3.082 | 3.002 |
| 3:15:34:636 | 3.085 | 3.076 | 3.088 | 3.071 | 3.082 | 3.002 |

TABLE 1-continued

Measured data of battery pack according to battery cell voltage compensation scheme

| 3:15:34:839 | 3.084 | 3.074 | 3.085 | 3.07 | 3.08 | 3 |
| 3:15:35:042 | 3.084 | 3.074 | 3.085 | 3.07 | 3.08 | 3 |

As shown in Table 1, when the battery pack is charged or discharged using a preset current I (I=400 A in FIG. 4), Vavg2 is calculated for data in row 204 of Table 1 (Vavg2=3070.3 mv). A difference V2 between a voltage Vcell40 (Vcell40=3000 mv) of the battery cell N40 and Vavg2 satisfies V2=70.3 mv>Y=I*R=20 my, and differences between voltages of the remaining battery cells and the average voltage of the battery cells in the modules in the battery pack are all less than Y. In this case, it can be determined that the sampling voltage of the battery cell N40 requires voltage compensation. It can be seen from FIG. 4 that the voltage of the battery cell N40 changing with time is always less than the voltages of the remaining battery cells in the module.

As shown in Table 1, an average voltage Vavg3 (Vavg3=3078.1 mv) of the remaining battery cells in the module after excluding the battery cell N40 requiring compensation is calculated, and a voltage difference $\Delta V3$ ($\Delta V3$=78.1 mv) between a sampling voltage of the battery cell N40 and Vavg3 is calculated, so as to calculate an impedance of a compensated busbar $R_{busbar}$=78.1 mV/400 A=0.195 mΩ.

The impedance of the busbar is stored in a memory, a voltage of the busbar can be calculated subsequently according to Ohm's law, and an impedance voltage of the busbar can be used to compensate the sampling voltage of the battery cell.

In row 204 of Table 1, the sampling voltage of the battery cell N40 is Vcell40=3000 mv, and an effective voltage after compensation is: 3000 mv+400 A*0.195 mΩ=3078.1 my. This value is the actual sampling voltage of battery cell N40 excluding the influence of the impedance of the busbar.

Figure 5:
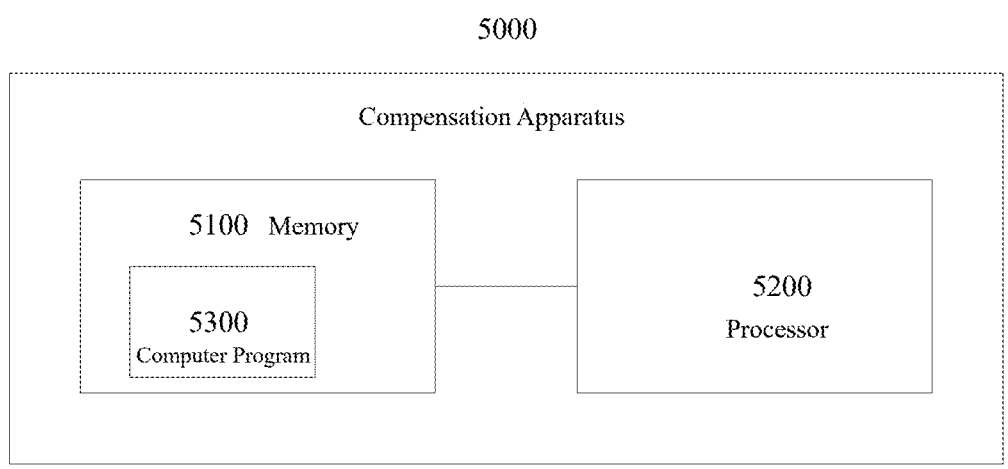
FIG. 5 is a block diagram of a battery cell sampling voltage compensation apparatus according to some embodiments of this application.

FIG. 5 is a block diagram of a battery cell sampling voltage compensation apparatus according to some embodiments of this application.

As shown in FIG. 5, the battery cell sampling voltage compensation apparatus 5000 of the present invention includes a memory 5100 and a processor 5200, where the memory 5100 stores a computer program 5300, and the processor 5200 is configured to: when executing the computer program, implement the foregoing battery cell sampling voltage compensation method of this application. According to one or more embodiments of the present invention, the encoded computer program 5300 (for example, computer and/or machine-readable instructions) stored on a non-transitory computer and/or machine-readable medium (for example, the memory 5100 may be a hard disk drive, a flash memory, a read-only memory, an optical disk, a digital versatile disk, a cache, a random access memory, and/or any other storage device or storage disk) may be used to implement processing in the foregoing method of the present invention and store information in a non-transitory computer and/or machine-readable medium for any period of time (for example, for an extended period of time, permanent storage, transitory instance, temporary caching, and/or information caching). As used herein, the term "non-transitory computer-readable medium" is clearly defined to include any type of computer-readable storage device and/or storage disk, and excludes both propagation signals and transmission media.

According to one or more embodiments of the present invention, the processor 5200 of the battery cell sampling voltage compensation apparatus 5000 may also include a non-transitory computer readable medium inside. The processor 5200 may be, for example, but not limited to, one or more single-core or multi-core processors. The (one or more) processors may include any combination of general purpose processors and dedicated processors (for example, graphics processors and application processors). The processor may be coupled thereto and/or may include a computer memory/storage device, and may be configured to execute instructions stored in the memory/storage device to implement various applications and/or operating systems running on the battery cell sampling voltage compensation apparatus 5000 of the present invention.

Figure 6:
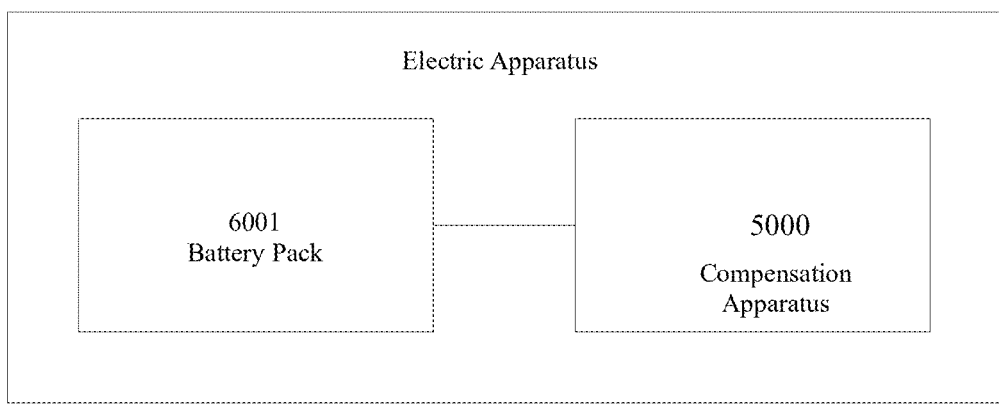
FIG. 6 is a block diagram of an electric apparatus according to some embodiments of this application.

FIG. 6 is a block diagram of an electric apparatus according to some embodiments of this application.

As shown in FIG. 6, the electric apparatus 6000 includes a battery pack 6001 and the foregoing battery cell sampling voltage compensation apparatus 5000 of the present invention. The battery pack includes a plurality of modules (for example, 1401, 1402, and 1403), and each module includes a plurality of battery cells (for example, C11 to C48). The electric apparatus is configured to provide electrical energy.

In conclusion, it should be noted that the foregoing embodiments are for description of the technical solutions of this application only rather than for limiting this application. Although this application has been described in detail with reference to the foregoing embodiments, persons of ordinary skill in the art should appreciate that they can still make modifications to the technical solutions described in the embodiments or make equivalent replacements to some or all technical features thereof without departing from the scope of the technical solutions of the embodiments of this application. All such modifications and equivalent replacements shall fall within the scope of claims and specification of this application. In particular, as long as there is no structural conflict, the various technical features mentioned in the embodiments can be combined in any manner. This application is not limited to the specific embodiments disclosed in this specification but includes all technical solutions falling within the scope of the claims.

The invention claimed is:

1. A battery cell sampling voltage compensation method performed by a voltage sampling apparatus to measure a battery cell sampling voltage of a battery cell, wherein the voltage sampling apparatus is electrically connected to a battery pack connected in series, the battery pack comprises a plurality of modules connected in series, each module comprises a plurality of battery cells connected in series, at least one cross-module busbar electrically connects two different battery cells respectively belonging to two different modules in the battery pack and is located in a sampling channel of the voltage sampling apparatus, the sampling channel is formed between two sampling terminals of the voltage sampling apparatus, the two sampling terminals are electrically connected to two electrode terminals of one of the two battery cells connected to the cross-module busbar respectively, and the method comprises the following steps:

after confirming that all battery cells connected to the voltage sampling apparatus are in a normal state, charging or discharging the battery pack at a preset current to obtain sampling voltages of the plurality of battery cells using the voltage sampling apparatus;

determining, based on the obtained sampling voltages of the plurality of battery cells, the battery cell connected to the cross-module busbar and requiring sampling voltage compensation in the plurality of modules, and calculating an impedance voltage of the cross-module busbar; and performing sampling voltage compensation on the battery cell requiring sampling voltage compensation based on the impedance voltage of the cross-module busbar.

2. The method according to claim 1, wherein the charging or discharging the battery pack at a preset current comprises circulating the preset current in all battery cells in the battery pack for a predetermined period of time.

3. The method according to claim 2, wherein the preset current is greater than a current for 1c charging/discharging of a battery cell, and the current for 1c charging/discharging of a battery cell is a current for the battery cell to be fully charged or fully discharged in 1 hour.

4. The method according to claim 3, wherein the preset current is a stable value during charging or discharging.

5. The method according to claim 1, wherein the determining a battery cell requiring sampling voltage compensation in the plurality of modules comprises:

calculating a difference between a sampling voltage of each battery cell in a module and an average sampling voltage of all battery cells in this module, and determining a battery cell for which the difference is greater than a first preset threshold as a battery cell requiring sampling voltage compensation.

6. The method according to claim 5, wherein the calculating an impedance voltage of the cross-module busbar comprises:

calculating a difference between a sampling voltage of the battery cell requiring sampling voltage compensation and an average sampling voltage of the remaining battery cells after excluding the battery cell requiring sampling voltage compensation from the module, determining an impedance of the cross-module busbar based on the difference and the preset current, and determining an impedance voltage of the cross-module busbar based on a current flowing through the cross-module busbar and the impedance of the cross-module busbar.

7. The method according to claim 6, comprising recording the impedance of the cross-module busbar, and predicting a state of the cross-module busbar based on multiple records of the impedance of the cross-module busbar.

8. The method according to claim 1, further comprising a step of determining whether a battery cell is in the normal state, wherein with the battery pack being in a resting state, when a difference between a sampling voltage of each battery cell in the module and an average sampling voltage of all battery cells in the module is less than a second preset threshold, it is determined that all battery cells in the module are in the normal state.

9. The method according to claim 8, wherein that the battery pack is in a resting state comprises: when a state of charge SOC of the battery pack is within a preset range, a flow current of the battery pack is a resting current.

10. The method according to claim 9, wherein the resting current is less than 5 A.

11. The method according to claim 9, wherein the preset range for the SOC of the battery pack is between 30% and 80%.

12. The method according to claim 1, comprising: when all battery cells in the battery pack are in the normal state, setting a condition test flag bit of the battery pack to 1.

13. The method according to claim 12, comprising: during use of the battery pack, when the condition test flag bit of the battery pack is 1, determining whether all battery cells in the battery pack are in the normal state, if at least one battery cell is not in the normal state, setting the condition test flag bit of the battery pack to 0 and redetecting whether all battery cells in the battery pack are in the normal state, and when it is determined that all battery cells in the battery pack are in the normal state, resetting the condition test flag bit of the battery pack to 1.

14. The method according to claim 1, wherein all battery cells in the battery pack are battery cells of a same type.

15. A battery cell sampling voltage compensation apparatus comprising a memory and a processor, wherein the memory stores a computer program, and the processor is configured to: when executing the computer program, implement the method according to claim 1.

16. An electric apparatus comprising a battery pack and the apparatus according to claim 15, wherein the battery pack is configured to supply electrical energy.

17. A battery cell sampling voltage compensation method performed by a voltage sampling apparatus to measure a battery cell sampling voltage of a battery cell, wherein the voltage sampling apparatus is electrically connected to a battery pack, the battery pack comprises a plurality of modules connected in series, each module comprises a plurality of battery cells connected in series, at least one cross-module busbar electrically connects two different battery cells respectively belonging to two different modules in the battery pack and is located in a sampling channel of the voltage sampling apparatus, and the method comprises:

after confirming that all battery cells connected to the voltage sampling apparatus are in a normal state, charging or discharging the battery pack at a preset current to obtain sampling voltages of the plurality of battery cells using the voltage sampling apparatus;

calculating, based on the obtained sampling voltages of the plurality of battery cells of one module of the plurality of modules, a difference between a sampling voltage of each battery cell an average sampling voltage of all battery cells in the module;

determining a battery cell for which the difference is greater than a first preset threshold as the battery cell connected to the cross-module busbar and requiring sampling voltage compensation;

calculating a difference between a sampling voltage of the battery cell requiring sampling voltage compensation and an average sampling voltage of the remaining battery cells after excluding the battery cell requiring sampling voltage compensation from the module;

determining an impedance of the cross-module busbar based on the difference and the preset current, and determining an impedance voltage of the cross-module busbar based on a current flowing through the cross-module busbar and the impedance of the cross-module busbar; and performing sampling voltage compensation on the battery cell requiring sampling voltage compensation based on the impedance voltage of the cross-module busbar.

18. A battery cell sampling voltage compensation method performed by a voltage sampling apparatus to measure a battery cell sampling voltage of a battery cell, wherein the voltage sampling apparatus is electrically connected to a battery pack, the battery pack comprises a plurality of modules connected in series, each module comprises a plurality of battery cells connected in series, at least one cross-module busbar electrically connects two different battery cells respectively belonging to two different modules in the battery pack and is located in a sampling channel of the voltage sampling apparatus, and the method comprises:

- when all battery cells in the battery pack are in the normal state, setting a condition test flag bit of the battery pack to 1;
- during use of the battery pack, when the condition test flag bit of the battery pack is 1, determining whether all battery cells in the battery pack are in the normal state, if at least one battery cell is not in the normal state, setting the condition test flag bit of the battery pack to 0 and redetecting whether all battery cells in the battery pack are in the normal state, and when it is determined that all battery cells in the battery pack are in the normal state, resetting the condition test flag bit of the battery pack to 1;
- after confirming that all battery cells connected to the voltage sampling apparatus are in a normal state, and charging or discharging the battery pack at a preset current to obtain sampling voltages of the plurality of battery cells using the voltage sampling apparatus;
- determining, based on the obtained sampling voltages of the plurality of battery cells, the battery cell connected to the cross-module busbar and requiring sampling voltage compensation in the plurality of modules;
- calculating an impedance voltage of the cross-module busbar; and
- performing sampling voltage compensation on the battery cell requiring sampling voltage compensation based on the impedance voltage of the cross-module busbar.

\* \* \* \* \*